United States Patent
Sekiguchi et al.

(10) Patent No.: US 7,982,709 B2
(45) Date of Patent: Jul. 19, 2011

(54) ILLUMINATING DEVICE AND LIQUID-CRYSTAL DISPLAY DEVICE USING THE SAME

(75) Inventors: Yoshifumi Sekiguchi, Hitachiota (JP); Ikuo Hiyama, Hitachinaka (JP); Tsunenori Yamamoto, Hitachi (JP); Hiroki Kaneko, Hitachinaka (JP); Toshiaki Tanaka, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 52 days.

(21) Appl. No.: 12/694,349

(22) Filed: Jan. 27, 2010

(65) Prior Publication Data

US 2010/0165246 A1    Jul. 1, 2010

Related U.S. Application Data

(62) Division of application No. 11/594,917, filed on Nov. 9, 2006, now Pat. No. 7,661,844.

(30) Foreign Application Priority Data

Nov. 11, 2005  (JP) ................................. 2005-326820
Jul. 31, 2006  (JP) ................................. 2006-207336

(51) Int. Cl.
*G09G 3/36* (2006.01)

(52) U.S. Cl. .................................. 345/102; 362/249.02

(58) Field of Classification Search .................. 345/102; 362/249.02
See application file for complete search history.

(56) References Cited

U.S. PATENT DOCUMENTS

| | | | | |
|---|---|---|---|---|
| 5,748,164 A | * | 5/1998 | Handschy et al. | 345/89 |
| 6,236,382 B1 | * | 5/2001 | Kawakami et al. | 345/83 |
| 6,317,112 B1 | * | 11/2001 | Handschy et al. | 345/89 |
| 6,857,767 B2 | | 2/2005 | Matsui | |
| 6,909,234 B2 | | 6/2005 | Chen | |
| 7,126,159 B2 | | 10/2006 | Itai | |
| 2005/0140640 A1 | * | 6/2005 | Oh et al. | 345/102 |
| 2005/0243577 A1 | | 11/2005 | Moon | |
| 2006/0091416 A1 | | 5/2006 | Yan | |
| 2006/0092634 A1 | | 5/2006 | Hiyama | |
| 2006/0208999 A1 | * | 9/2006 | Lee et al. | 345/102 |
| 2006/0220046 A1 | | 10/2006 | Yu | |

(Continued)

FOREIGN PATENT DOCUMENTS

CN           1693969           11/2005

(Continued)

OTHER PUBLICATIONS

R. SA. West, "High Brightness Direct LED Backlight for LCD-TV", SID 03 Digest, pp. 1262-1265, 2003.

(Continued)

*Primary Examiner* — Richard Hjerpe
*Assistant Examiner* — Sahlu Okebato
(74) *Attorney, Agent, or Firm* — Antonelli, Terry, Stout & Kraus, LLP.

(57) ABSTRACT

An illuminating device capable of being produced at low costs and irradiating rays of light uniformly to a liquid crystal panel. The illuminating device has a plurality of LED packages each having LED's and a lens, the LED packages being congregated on a plane in a large area. Each of the LED packages includes at least four LED's corresponding to LED's for emitting at least red, green and blue, and at least two of the LED's in each LED package are positioned symmetrically to the center of the lens and emit the same color.

33 Claims, 16 Drawing Sheets

U.S. PATENT DOCUMENTS

2006/0261365 A1 11/2006 Hsu
2007/0030674 A1 2/2007 Kim

FOREIGN PATENT DOCUMENTS

| | | |
|---|---|---|
| JP | 09-16105 | 1/1997 |
| JP | 2003-008068 | 1/2003 |
| JP | 2003-008081 | 1/2003 |

OTHER PUBLICATIONS

Shiga et al, "Adaptive Dimming Technique With Optically Isolated Lamp Grounds", SID 05 Digest, pp. 992-995, 2005.

* cited by examiner

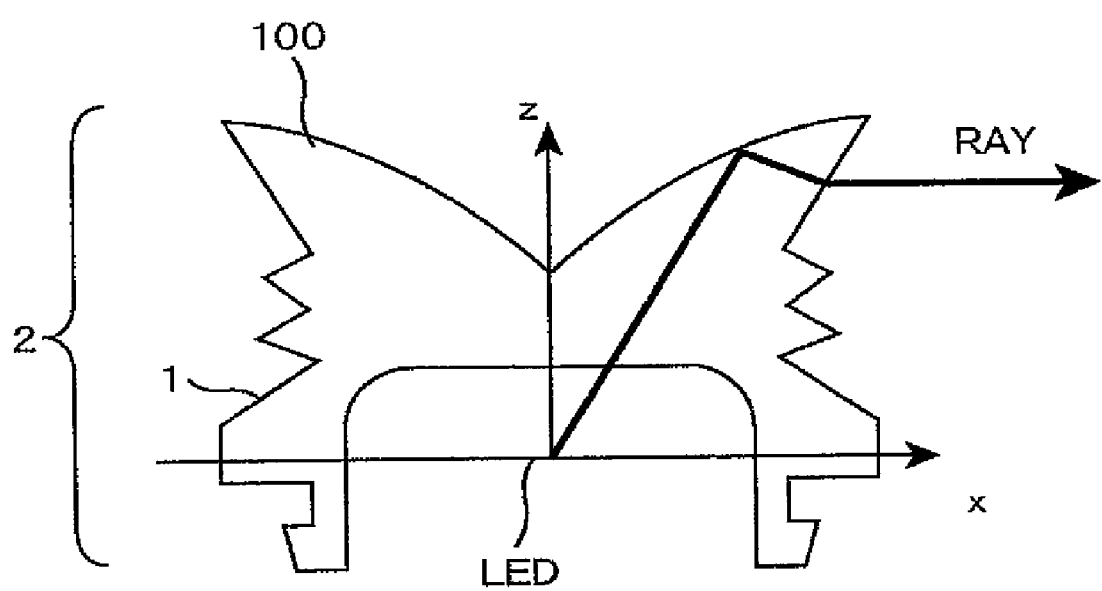

ILLUMINATING DEVICE AND LIQUID-CRYSTAL DISPLAY DEVICE USING THE SAME

CROSS REFERENCE TO RELATED APPLICATION

This application is a divisional application of U.S. application Ser. No. 11/594,917, now U.S. Pat. No. 7,661,844 filed Nov. 9, 2006, the contents of which is incorporated herein by reference.

BACKGROUND OF THE INVENTION

The present invention relates to a display device such as a television or monitor and more particularly to an illuminating device for irradiating rays of light uniformly on a liquid crystal panel and a liquid crystal display device using the same.

A light emitting diode (hereinafter referred to as LED) package comprised of LED's and a lens is disclosed in JP-A-2003-8068 (Document 1) or JP-A-2003-8081 (Document 2).

The contents of Patent Document 1 reads "A lens has a lens proper which comprises a center axis extending along a longitudinal direction of the lens proper, a first surface for coupling to a light source, a saw-toothed lens portion for refracting light emitted from the light source in such a manner that most of the light going out of the saw-toothed lens portion is made to be substantially vertical to the center axis of the lens proper and a funnel-shaped lens portion connected to the saw-toothed lens portion to reflect the light emitted from the light source in such a manner that most of the light going out of the funnel-shaped lens portion is made to be substantially vertical to the center axis of the lens proper."

"High Brightness Direct LED Backlight for LCD-TV" by R. West, SID03 DIGEST, pp. 1262-1265 (Document 3) is concerned with a liquid crystal display device using, as a backlight, an illuminating device employing an LED package comprised of LED's and a lens.

"Adaptive Dimming Technique with Optically Isolated Lamp Groups" by T. Shiga, SID05 DIGEST, pp 992-995 (Document 4) discloses a technique for improving quality of motion pictures by interposing a reflector between lamps in a cold cathode fluorescent lamp (CCFL) backlight but it does not refer to a light emitting diode (LED) representing a point light source.

SUMMARY OF THE INVENTION

Problems to be solved by this invention will first be described with reference to FIG. 2. In the figure, a plane on which an LED package 2 is located will be called an x-y plane and a direction vertical to the x-y plane will be called a z-direction. Illustrated in FIG. 2 is a sectional view, taken on an x-z plane, of a lens 1. The lens is rotationally symmetric to z-axis. The LED package 2 includes a single LED and the lens 1 having a funnel-shaped portion (called a funnel portion 100). Members such as wiring lines are provided in association with the LED package 2 but they are not illustrated for simplicity of explanation.

Any one of the techniques described in Documents 1 to 3 adopts a lens shape having a funnel portion similar to that shown at 100 in FIG. 2. The funnel portion 100 is designed as a total internal reflection (TIR) surface. The TIR surface reflects rays of light so that they may go out of the lens 1 at an angle of as approximately 90° as possible making to the z-axis. A ray trace of light emitted from the LED is exemplified as indicated at RAY.

For production of lens 1 at low costs, injection molding may preferably be employed. The funnel portion 100, however, provides a protruded ring portion that causes entanglement or engagement which disturbs smooth removal of the mold, making it difficult to perform molding with a single mold. Accordingly, the funnel portion and the rest of lower lens portion are produced separately, followed by bonding of the two parts or alternatively casting is carried out using a plurality of molds. In any case, plural molds are used for production of the lens, resulting in a problem of high production costs. The casting based on plural molds has difficulties in shaping the lens with high accuracy.

The aforementioned prior arts do not consider an influence they have upon the production method and disadvantageously, bring about high costs and a degradation in production accuracy.

An object of the present invention is to provide an illuminating device which can be produced at low costs and can irradiate rays of light uniformly on a liquid crystal panel and a liquid crystal display device using the same.

According to the present invention, to solve the problems the invention faces, in an illuminating device comprising a plurality of LED packages each having LED's and a lens, the LED packages being congregated on a plane in a large area, each of the LED packages includes at least four LED's corresponding to LED's for emitting at least red, green and blue, and at least two of the LED's in each LED package are positioned symmetrically to the center of the lens and the two LED's emit the same color.

To solve the problems, in an illuminating device comprising a plurality of LED packages each having LED's and a lens, the LED packages being congregated on a plane in a large area, each of the LED packages includes LED's for emitting at least red, green and blue, and at least two kinds of LED packages are provided in which the arrangement of LED's in one kind of LED package differs from that of LED's in the other kind of LED package.

To solve the problems, in a liquid crystal display device comprising: a liquid crystal panel having a pair of substrates, a liquid crystal layer sandwiched between the paired substrates, data lines for applying to the liquid crystal layer a voltage corresponding to image data at a predetermined timing and gate lines, a plurality of active elements connected to intersections of the data lines and the gate lines and pixels driven by the active elements; and an illuminating device having a plurality of LED packages each including LED's and a lens, the LED packages being congregated on a plane in a large area to provide a backlight for irradiating light to the liquid crystal panel, wherein, on a plane substantially parallel to the liquid crystal panel, a column direction is defined as a direction substantially parallel to a direction in which the gate line extends and a row direction is defined as a direction substantially orthogonal to the column direction, the bottom of the backlight having the congregated LED packages being divided into two or more plural regions, and there is provided means for driving the LED's individually or in respect of each of the plurality of regions and the lens in each of the LED packages has different widths between in the column direction and row direction.

To solve the problems, in a liquid crystal display device comprising: a liquid crystal panel having a pair of substrates, a liquid crystal layer sandwiched between the paired substrates, data lines for applying to the liquid crystal layer a voltage corresponding to image data at a predetermined timing and gate lines, a plurality of active elements connected to intersections of the data lines and the gate lines and pixels driven by the active elements; and an illuminating device having a plurality of LED packages each including LED's and a lens, the LED packages being congregated on a plane in a large area to provide a backlight for irradiating light to the liquid crystal panel, wherein, on plane substantially parallel to the liquid crystal panel, a column direction is defined as a direction substantially parallel to a direction in which the gate line extends and a row direction is defined as a direction substantially orthogonal to the column direction, the bottom of the backlight having the congregated LED packages being divided into two or more plural regions and there is provided means for driving the LED's individually or in respect of each of the plurality of regions, and the lens in each of the LED packages has a portion which differs in width in accordance with the azimuth.

The present invention is in no way limited to constitutions recited in the appended claims and constitutions disclosed in embodiments to be described hereinafter and can obviously be changed and modified in various ways without departing from the technical idea of the present invention.

Advantageously, in the present invention, low production costs can be attained and the liquid crystal panel can be illuminated uniformly with light.

Other objects, features and advantages of the invention will become apparent from the following description of the embodiments of the invention taken in conjunction with the accompanying drawings.

BRIEF DESCRIPTION OF THE DRAWINGS

FIG. 2 is a diagram for explaining problems to be solved by the present invention.

DESCRIPTION OF THE EMBODIMENTS

The present invention will now be described by way of example with reference to the accompanying drawings.

Embodiment 1

Figure 1A:
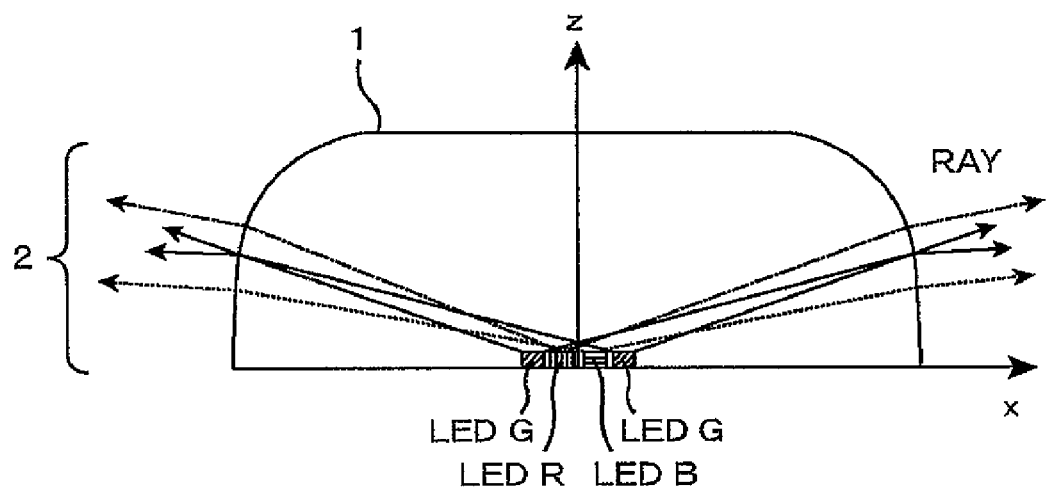
FIG. 1A is a diagram for explaining an example of an illuminating device according to embodiment 1 of the present invention.

Embodiment 1 of the present invention will be described. Referring first to FIG. 1A, an example in embodiment 1 is illustrated in which an LED package 2 includes LED's for red, blue and green (designated by LEDR, LEDB and LEDG, respectively, in the figure) and a lens 1, having in particular LED's for green by two. The LED's for red and blue are arranged closely to the center and the LED's for green are arranged more remotely from the center than the LED's for red and blue, with the two LED's for green being equidistant from the center on a straight line passing through the center. In other words, the two LED's are positioned symmetrically to the center. A plane on which the LED package 2 is located is an x-y plane and a direction vertical to the x-y plane in which light is emitted for illumination is called a z-direction. Illustrated FIG. 1A is a sectional view or form taken on an x-z plane. The lens is rotationally symmetrical with respect to z-axis.

In comparison with an instance where only one LED is included in an LED package, that is to say, an LED package for emission of light in red, an LED package for emission of light in blue and an LED package for emission of light in green are arranged in an illuminating device to irradiate light in white, the number of lenses can be reduced when the LED package including three LED's for red, blue and green is used, minimizing the amount of materials and reducing garbage.

Figure 1B:
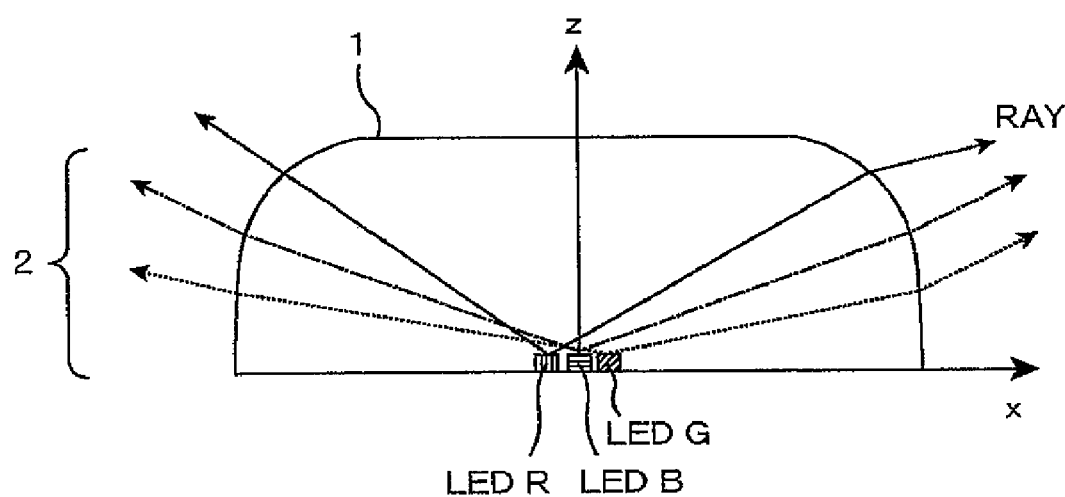
FIG. 1B is a diagram for explaining another example of the illuminating device in embodiment 1.

But in case LED's for red, blue and green are arranged simply one by one as illustrated in FIG. 1B, emission of light from an LED positioned in the center of the lens is isotropic on the x-y plane but emission of light from two LED's positioned off-center is anisotropic. The reason is because the lens shape is designed by deeming the LED in the center as a point light source.

Further, the LED's in the LED package are different colors and therefore, when accompanied by largely different output distributions from the lens, different colors cannot be mixed and non-uniformity of color results. Especially, the LED's positioned on the opposite ends are apart from the center in reverse directions, with the result that the output distributions are biased in reverse directions, giving rise to a large factor of making color non-uniform. This problem can possibly be solved by enlarging the size of the lens until the three LED's can be deemed to be as small as a point light source when viewed from the lens. The lens enlarged in size, however, raises a problem that the thickness of the illuminating device increases correspondingly.

The problem as above can be solved with the construction as shown in FIG. 1A. By arranging the two LED's for green symmetrically with respect to the center, changes in distributions of output of light due to the offset positioning from the center can be compensated mutually and anisotropic output distribution can be upgraded to isotopic output distribution. This meritorious advantage can be obtained by arranging the LED's for the same color substantially symmetrically with respect to the center of lens. Namely, strict symmetrical positioning is not required for attaining the above advantage. Extremely speaking, when the x-y plane is halved by a straight line connecting an LED and the lens center, another LED for the same color can be positioned in a region different from that for the former LED, thereby enabling the compensation effect to be fulfilled.

Further, by positioning the two LED's for green more remotely from the center than the LED's for red and blue, the LED's for red and blue exhibiting respectively output distributions which cannot compensate for each other can be positioned closely to the center and color mixing can be facilitated.

The LED for green is chosen as an LED for which compensation is made in the present embodiment for the reason that the LED for green has low power efficiency and for the sake of obtaining a sufficient luminance, LED's for green are preferably employed in greater number than LED's for other kinds of color.

Further, by positioning the center of lens in the middle of the LED's for red and blue, the distance between the lens center and each of the LED's for red and blue can be small. Where the minimum distance by which the LED's can approach mutually is $L_G$, the distance between the lens center and each of the LED's for red and blue is $L_G/2$. In the example shown in FIG. 1B, the distance between the lens center and each of the LED's at the opposite ends is (length half the size of the LED in the center)+$L_G$.

Figure 3A:
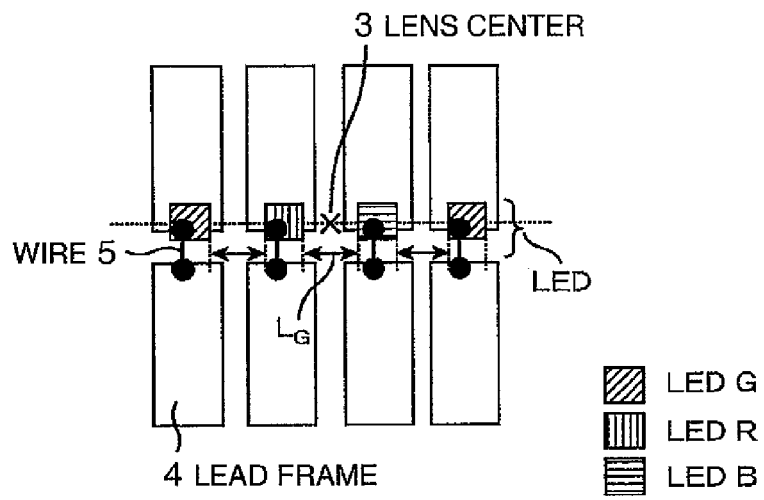
FIGS. 3A to 3D are diagrams useful to explain examples of mounting LED's in the illuminating device in embodiment 1.

Compensation is possible for the LED for green but close positioning of the green LED to the lens center is preferable. All of the three LED's can approach a lens center 3 in the most simplified fashion as shown in FIG. 3A. In an example shown in FIG. 3A, a lead frame is used in association with each LED. With the lead frames used, the LED's are brought into a line in the most simplified configuration. Throughout the LED's, the distance between adjacent LED's is set to the minimum distance $L_G$, thereby ensuring that the two LED's which are furthermost from the lens center 3 can be arranged symmetrically while permitting the LED's in an LED package to be positioned most closely to the lens center 3. Even if the equidistant positioning of the LED's is disturbed within about 0.1 to 0.3 mm, the aforementioned compensation effect can still be valid.

Figures 3B, 3C:
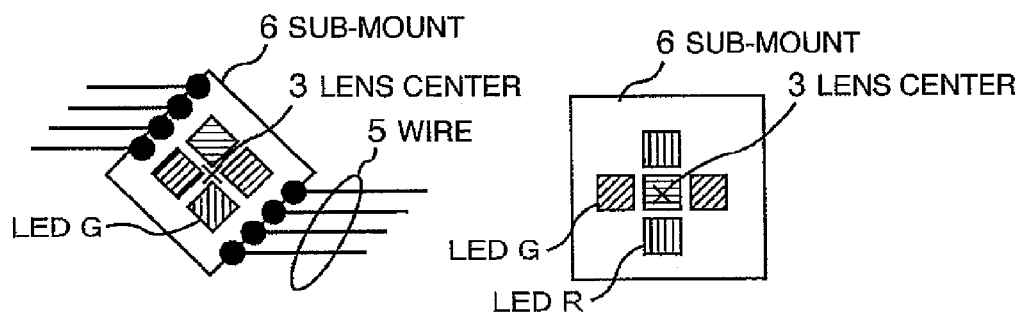

When it comes to making the LED's most approach the lens center, the LED's can be mounted on a sub-mount 6 formed with wiring lines as shown in FIG. 3B. In this case, too, the LED's for green are positioned symmetrically to the lens center 3.

Figure 3D:
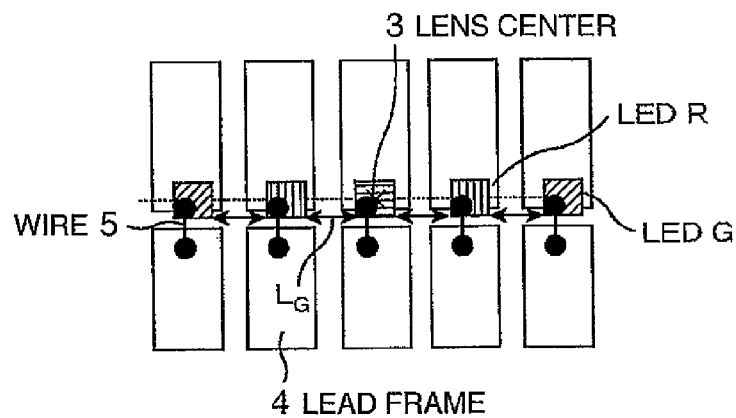

Conceivably, an LED exhibiting a large quantity of emission light is arranged in the center and LED's exhibiting a less quantity of emission light are arranged on either side of the centrally located LED. Also conceivably, an LED having high power efficiency is arranged in the center and two LED's having low power efficiency are arranged on either side. Alternatively, a single LED for blue having a less influence upon luminance is arranged in the center and sets of two LED's for other kinds of color are arranged on both sides of the centrally located LED. Illustrated in FIGS. 3C and 3D are examples in which five LED's are included in an LED package and an LED for blue less affecting luminance is arranged in the center, with sets of remaining LED's for the same color other than blue positioned symmetrically to the lens center. In this case, because of the provision of the plurality of LED's, the quantity of light obtained from a single package can be increased and therefore, the number of LED packages to be used can be reduced. In other words, materials can be reduced, leading to garbage reduction and working cost reduction.

In FIGS. 3A to 3D, compensation for the green LED is not always necessary but because of low efficiency of the LED for green, it is preferable that a plurality of LED's for green be included in an LED package and handled as LED's for which compensation is conducted.

In connection with the arrangement of the LED for color for which no compensation is made, the relation between arrangement and color is not particularly stipulated. For example, in FIGS. 3A to 3D, the position of the LED for red can be exchanged with that of the LED for blue.

Embodiment 2

Figure 4A:
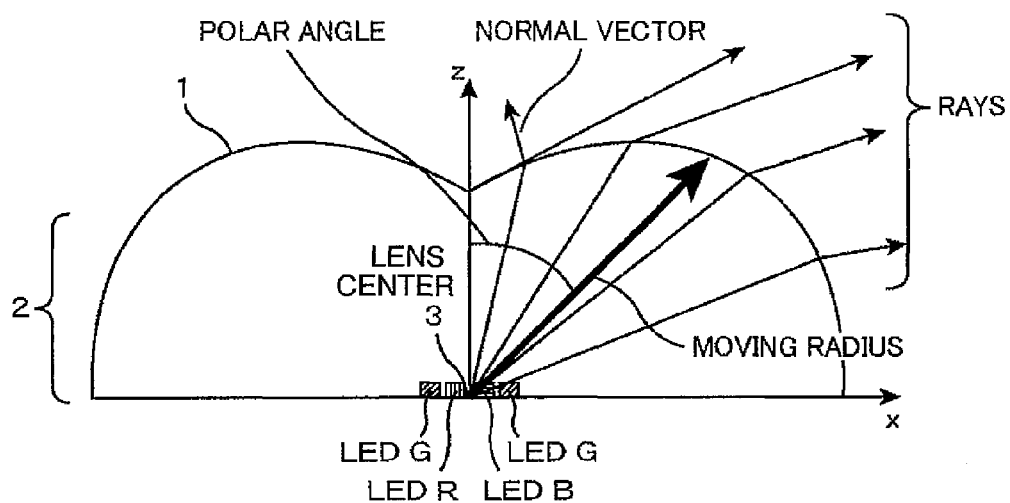
FIGS. 4A to 4C are diagrams useful to explain an illuminating device and liquid crystal display device according to embodiment 2 of the invention.
Figure 4B:
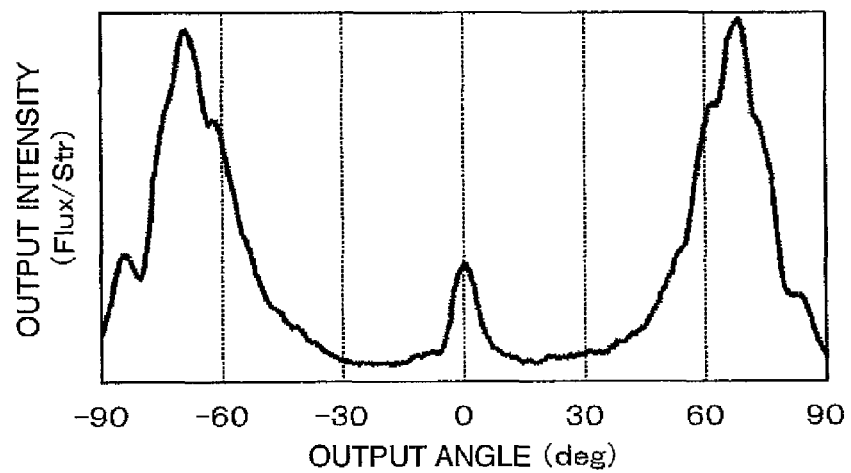
Figure 4C:
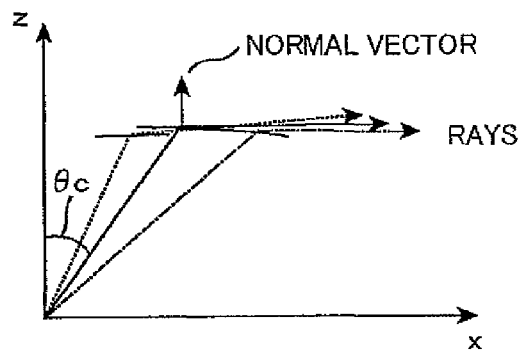

Referring now to FIG. 4A to 4C, embodiment 2 of the present invention will be described. Illustrated in FIG. 4A is an example where an LED lens package 2 includes LED's for red, blue and green (designated by LEDR, LEDB and LEDG, respectively, in the figure) and a lens 1, having in particular LED's for green by two. The LED's for red and blue are arranged closely to the center and the LED's for green are arranged more remotely from the center than the LED's for red and blue, with the two LED's for green being equidistant from the center on a straight line passing through the center.

A plane on which the LED package 2 is located is an x-y plane and a direction vertical to the x-y plane in which light is emitted for illumination is called a z-direction. Illustrated in FIG. 4A is a sectional view or form taken on an x-z plane. The lens is rotationally symmetrical with respect to z-axis.

In the present embodiment, the z-axis represents a center axis being vertical to the plane on which the LED package is located and passing through the center of the lens. Where the distance starting from the lens center and ending in the lens surface is defined as a moving radius and the angle the moving radius makes to the center axis is defined as a polar angle, the lens is so shaped that the moving radius increases as the polar angle increases within a range of almost values of polar angle (substantially, 0° to 80° of polar angle). In a range of polar angles being in excess of 80°, the moving radius remains unchanged. Accordingly, with the lens shape, there is no region in which as the polar angle increases, the moving radius becomes smaller.

The lens shown in the figure causes much light to go out at light output angles corresponding to polar angles of 45° or more. Illustrated in FIG. 4B is the relation between output intensity and output angle. The output angle is indicated in terms of polar angle and is positive for the polar angle directed from the center axis to the positive direction of x-axis and is negative for the polar angle directed from the center axis to the negative direction of x-axis. Abscissa represents the output angle from the lens in a unit of degree and ordinate represents the flux per solid angle. The intensity is enhanced within a range of from 45° output angle to 80° output angle.

According to embodiment 1, in the LED package including LED's for red, blue and green, the LED's are arranged symmetrically with respect to the lens center and concentrically localized to the lens center, so that the output distribution from the lens can be isotropic on the lens mounted plane to achieve color uniformity.

By using the lens shown in FIG. 4A, most of rays of light can go out of the lens in an in-plane direction (including directions defined by large polar angles 45° to 90°) and as a result, rays of light can be uniformed in the in-plane, thus being further uniformed in the illuminating device prior to outgoing from the illuminating device.

Since the lens shown in FIG. 4A is so shaped as not to have a region in which as the polar angle increases, the moving radius decreases, the lens shape is free from any protruded portion which would disturb the removal of the mold in injection molding process in the z-direction (contrarily, if the moving radius gradually decreases in a range of polar angles 60° to 90°, for example, a protruded ring portion which disturbs removal of the mold will be formed within the associated region). Therefore, there is no need of using a plurality of molds and molding can be conducted with a single mold, ensuring that the precision of the mold can be upgraded and a product can be obtained quickly through a simplified process to assure reduction in production costs and reduction in energy consumed in the manufacture as well. Due to manufacture accuracies, an error of about several of hundreds of μm takes place which in turn sometimes causes the moving radius to decrease as the polar angle increases but no plural molds are needed for compensating the mold for irregularities of about several of hundreds of μm. Accordingly, in the case where the error of several of hundreds of μm is neglected, unless a region where as the polar angle increases, the moving radius becomes smaller takes place, plural molds are unnecessary.

The lens is recessed in the center for the reasons to be described below. In order to enhance the output angle at polar angles ranging from 0° to approximate critical angle $\theta c$ a substance forming the lens exhibits in relation to air (38° to 46° in the case of a lens made of usual plastic), a normal vector at the lens surface is inclined in a direction in which an x-component of the normal vector becomes negative when a lens surface portion of interest is at a positive position of x but in a direction in which an x-component of the normal vector becomes positive when the lens surface portion of interest is at a negative position of x. As a result, individual surface elements at the lens surface being at positive positions of x shift to the z-axis direction as they transit in the x direction but individual surface elements at the lens surface being at negative positions of x shift to the z-axis direction as they transit in the -x direction. In this manner, a z-axis component of a tangential line at each surface element can be allowed to be positive.

In the lens shaped as above, where the substance forming the lens exhibits the critical angle $\theta c$ in relation to air (when the refractive index of the lens is Nm, the critical angle $\theta c$ is given by $Nm \times \sin(\theta c)=1$), the region in which the moving radius increases as the polar angle increases includes a polar angle equal to the critical angle for the reasons to be described below with reference to FIG. 4C. In order to cause rays of light emitted from the LED's and prevailing near the critical angle to go out of the lens thereby in an in-plane direction (direction of polar angle 90°), the tangential direction at the lens surface in the critical angle direction must be substantially parallel to the z-axis. In this case, a z-axis component of the tangential line at the lens surface is almost zeroed and its x-component has a value nearly equal to 1. Accordingly, when transiting in the x-direction, the surface element on the lens surface moves in substantially parallel to the x axis and as a result the moving radius extends. For the reasons set forth above, near the critical angle, the moving radius increases as the polar angle increases.

Further, the lens shape described as above in the present embodiment is particularly sensitive or vulnerable to the offset of the LED arrangement from the lens center. Accordingly, for the present lens shape, the LED arrangement constitution explained in embodiment 1 is especially important. Reasons for this will be described with reference to FIG. 5.

Figure 5:
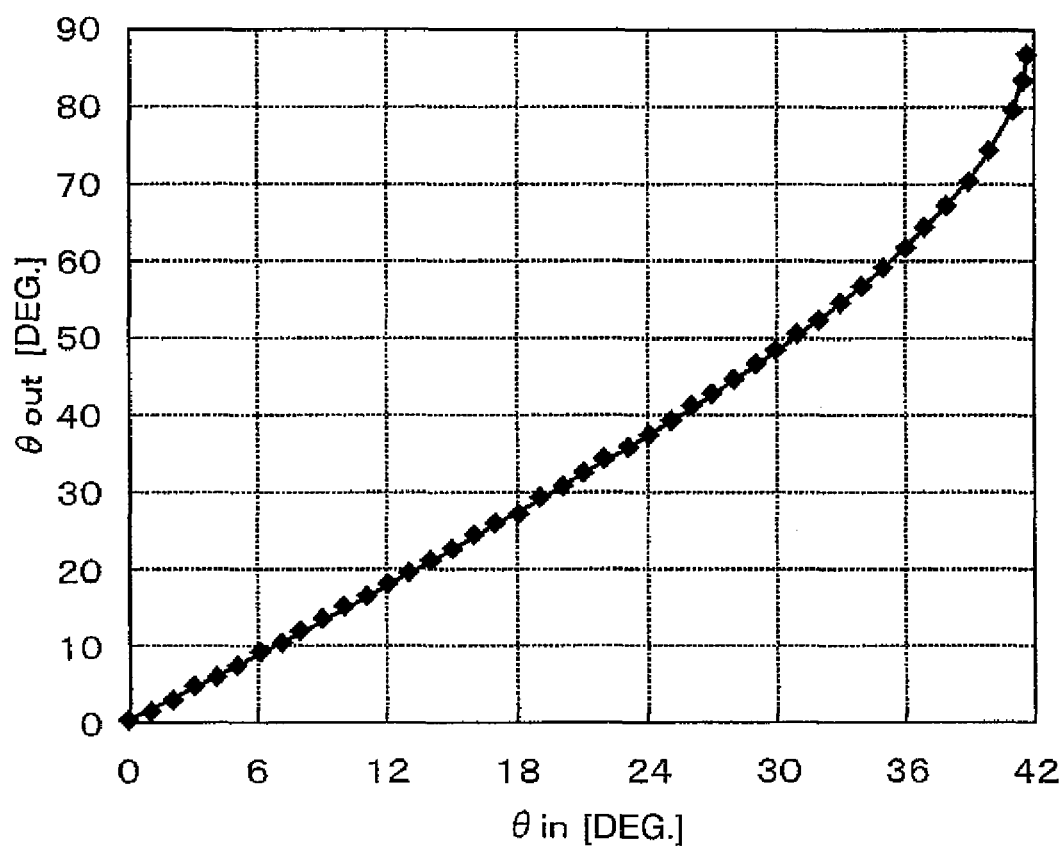
FIG. 5 is a graph for explaining characteristics of the illuminating device and liquid crystal display device in embodiment 2.

When light is incident on a lens of a refractive index of 1.5 at an angle $\theta$in making to the normal of the lens surface, the light goes out of the lens to air at output angle $\theta$out as graphically depicted in FIG. 5. In the figure, abscissa and ordinate are both in a unit of degree. It will be appreciated from the illustration that as the incident angle $\theta$in increases, the output angle $\theta$out steeply increases in a range of from 60° to 90° of output angle $\theta$out. In other words, this means an increase in a differential value $d\theta$out$/d\theta$in, demonstrating that in the range of the output angle exceeding 60°, the output angle $\theta$out changes greatly in response to a shift of incident angle, that is, an offset of the LED from the center.

Accordingly, in the case of the lens shape effective to output much light at large output angles (45° to 90°) explained in connection with the present embodiment, the output distribution changes to a great extent in the event of an offset of the LED from the lens center and therefore, the LED arrangement constitution explained in embodiment 1 is especially important.

Embodiment 3

In the present embodiment, LED's are driven region by region to turn on or off them at timings region by region, thereby providing an illuminating device which serves as a backlight for a liquid crystal display device by considering improvements in picture quality of the liquid crystal display device.

The picture quality is improved by changing image data to raise the transmission factor of the liquid crystal panel region by region while reducing brightness of a corresponding region of the illuminating device to achieve low power consumption or raising effective contrast. Also, improvements in quality of motion picture are intended by adopting the scrolling backlight method in which regions comprised of one or plural rows are sequentially turned on or off. In this case, it is of great importance to uniformly lighten individual arbitrary regions of the illuminating device. In other words, while in embodiment 2 rays of light are uniformed all over the backlight surface by outputting as much light as possible in the in-plane direction of backlight, uniformity in individual regions is dealt with in the present embodiment. Especially, in the present embodiment, an illuminating device which can realize uniform lighting in every region is contemplated.

Figure 6A:
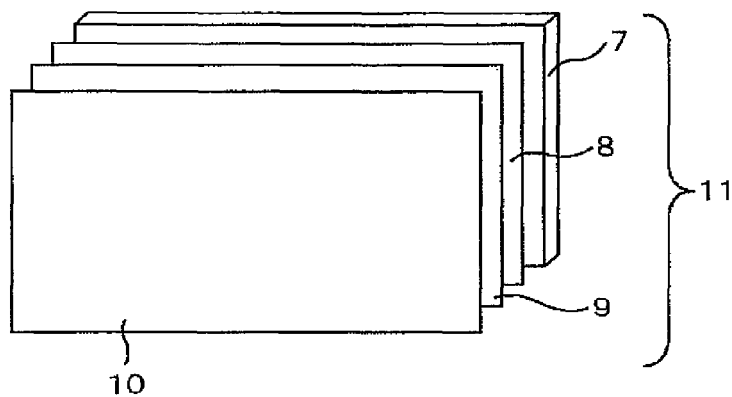
FIGS. 6A to 6C are diagrams useful to explain an illuminating device and liquid crystal display device according to embodiment 3 of the invention.
Figure 6B:
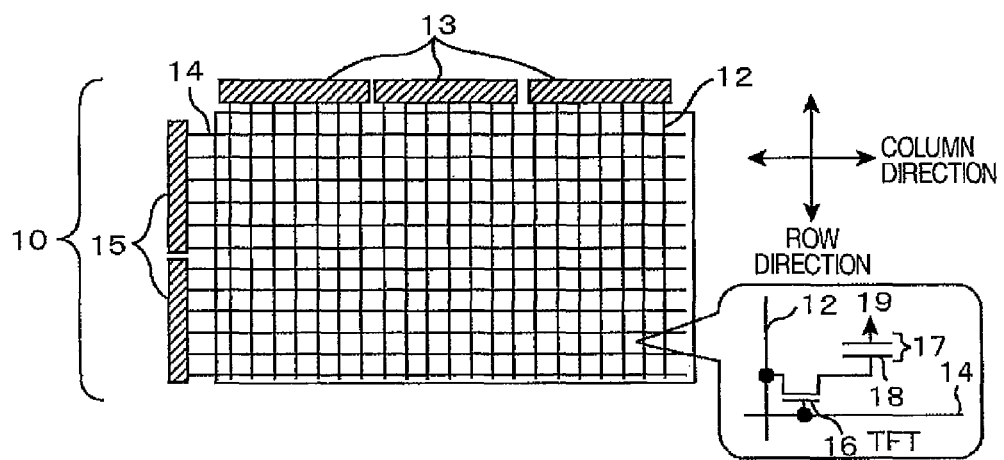
Figure 6C:
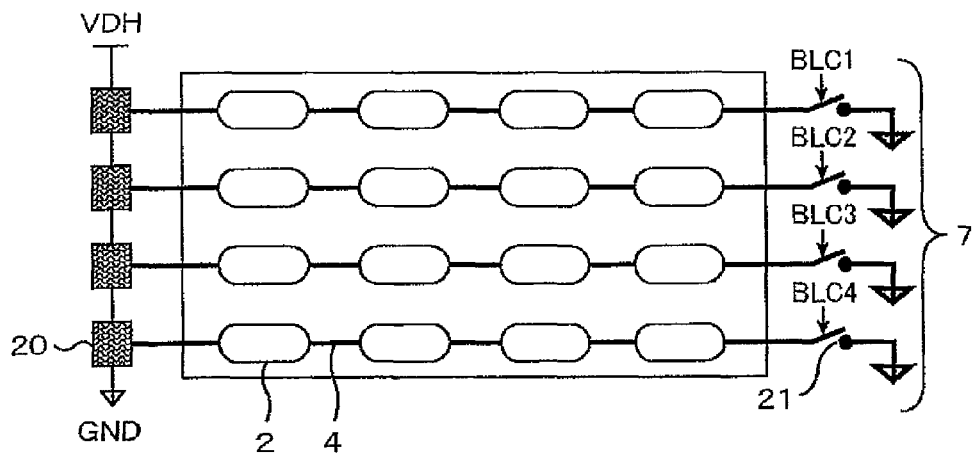

With reference to FIGS. 6A to 6C, embodiment 3 of the present invention will be described. Illustrated in FIG. 6A is an example of construction of a liquid crystal display device 11 comprising an illuminating device 7, a diffuser 8, an optical film 9 and a liquid crystal panel 10. The optical film 9 is a film for diffusing or collecting light and may sometimes include a diffuser sheet, a BEF and a DBEF. The illuminating device 7 is used as a so-called backlight of the liquid crystal display device.

Illustrated in FIG. 6B is an example of construction of the liquid crystal panel. Source drivers 13 drive data lines 12, gate drivers 15 drive gate lines 14 and thin-film transistors 16 representing active elements are connected to intersections of the data lines and the gate lines. The gate line on/off controls the thin-film transistor playing the role of a switch and the data line applies a desired voltage to liquid crystal of each pixel. Electrically, the liquid crystal is represented by a capacitor (liquid crystal capacitor 17) formed between a pixel electrode 18 connected to the thin-film transistor and a common electrode 19.

Illustrated in FIG. 6C is an example of construction of illuminating device 7 having a large area in the form of a coplanar congregation of LED packages 2. The LED package 2 includes LED's and a lens 1. But the LED package may sometimes include a heat sink member, a sub-mount and the like member which are not illustrated for simplicity of explanation.

The illuminating device shown in FIG. 6C includes four regions and means for driving LED's in respect of four individual regions. The LED packages 2 aligned in a column direction substantially parallel to a direction in which the gate line 14 extends are electrically connected in series by using lead frames and LED control switches 21 are driven using control signals BLC1 to BLC4 to drive the LED packages 2, connected in series in individual rows, row by row.

LED power supply circuits 20 are adapted to supply power to the LED's in the individual rows and they are connected to power supply voltage VDH and ground GND to generate and supply voltages to the individual rows. When the LED package 2 includes a plurality of LED's, for example, three LED's for red, blue and green, each of the LED power supply circuits 20 supplies three voltages and three lead frames 4 are provided for each row, of which individual ones for individual kinds of color are connected in series. Also, three LED control switches 21 are provided for each row. When the LED control switch is controlled in respect of the individual kinds of color, the control signal is also tripled in number. The LED's are sequentially turned on or off row by row while scrolling the turn on or off position, thus improving the quality of motion picture.

The lens 1 constituting the LED package 2 is so shaped as to have a lens width in column direction which is different from that in row direction. Since a region to which the LED packages belong is elongate in the column direction, realization of uniformity in the column direction is considered by making the lens shape have the lens width in column direction longer than that in the row direction.

As described in embodiment 2, in the lens designed to increase the output angle for uniformity of rays of light, the moving radius increases as the incident angle of light from the LED on the lens surface increases and consequently, the width of lens in the direction in which the output angle increases is enlarged in the direction in which the width of the region is large. The ratio between the width in column direction and the width in row direction depends on the size and shape of the backlight and region but where the major lens width is about 18 mm, the minor lens width often measures about 10 to 17 mm.

In addition, a variety of combinations of lens shapes can be conceivable. Examples are illustrated in FIGS. 7A to 7D. For better understanding of explanation, LED packages 2 to be driven simultaneously at a desired timing are enclosed with dotted line to define a region 22. Shapes of illustrated LED packages 2 and 2' reflect lens shapes, respectively. In FIGS. 7A to 7D, the lens package 2 includes a lens whose shape is elongated in a direction whereas the lens package 2' includes a lens whose shape has a diameter which is substantially equal in all directions.

Figure 7A:
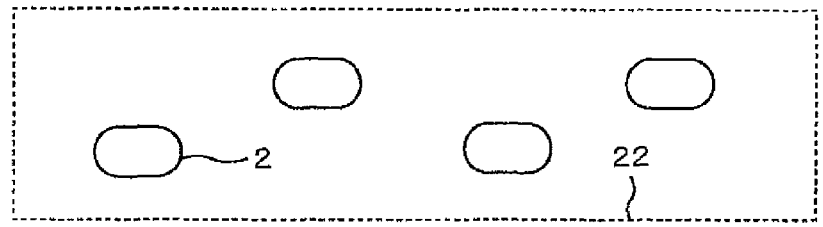
FIGS. 7A to 7D are diagrams useful to explain examples of regions in the illuminating device and liquid crystal display device in embodiment 3.
Figure 7B:
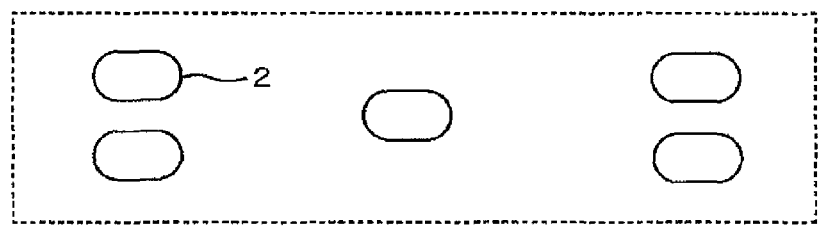

In FIGS. 7A and 7B, the lens width is elongated in a direction in which the width of a region is elongated, so that the lens is so shaped as to output rays of light at large output angles in the direction of the major width of region.

Figure 7C:
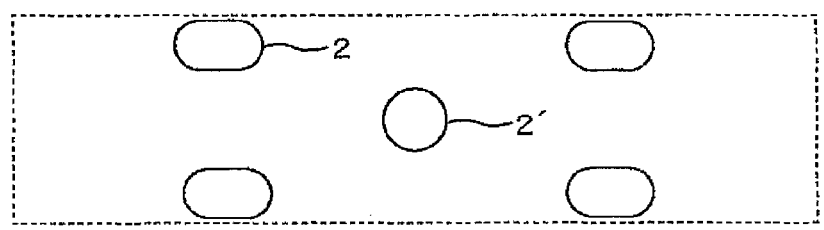
Figure 7D:
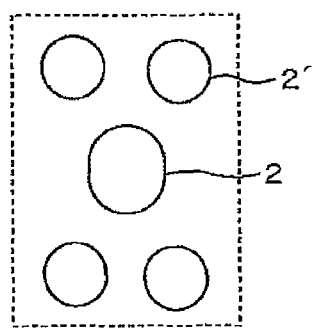

In FIGS. 7C and 7D, the lens shaped to be elongated in a direction and the lens shaped to have a substantially equal diameter in all directions are included in a region and the lens of the oblong shape has a major lens width in the elongate direction of the region. By combining the lens having different lens widths depending on the azimuth and the lens having the isotropic lens width in accordance with the azimuth, a region of a desired shape can be made to be uniform for light distribution.

According to embodiment 1, in an LED package including LED's for red, blue and green, the LED's are arranged symmetrically to the center of the lens and besides they are localized at the lens center so that the output distribution from the lens may be isotropic on the lens mounted plane to make the light uniform. In the present embodiment, too, uniformity in the region plane is achieved by increasing the output angle of light from the lens and besides, what counts is uniformity achieved by taking the arrangement of the LED's into consideration.

Figure 8A:
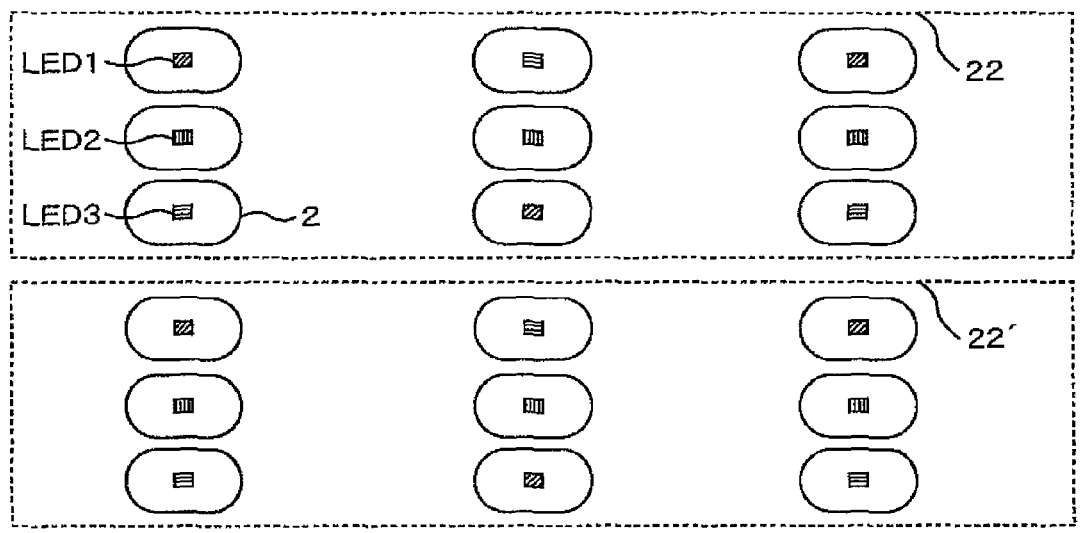
FIGS. 8A and 8B are diagrams useful to explain further examples of regions in the illuminating device and liquid crystal display device in embodiment 3.
Figure 8B:
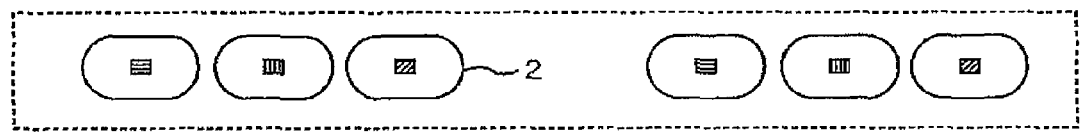

In case only one LED is included in an LED package, it is preferable that three LED packages having LED's for red, blue and green, respectively, be arranged closely to one another, indicating that an arrangement as shown in FIG. 8A is preferable for uniformity of an oblong region. In the figure, LED's 1 to 3 designate LED's for different kinds of color. In this arrangement, lighting timings are temporally different for regions 22 and 22' but if the difference of lighting timing is sufficiently small, different kinds of color in the adjacent regions can be mixed. In this example of arrangement, the lens shape in the LED package in the middle of the three cooperative LED packages (LED package 2 in the figure) in each region may differ from that in the oppositely adjacent LED packages. The LED packages at the opposite ends of the three cooperative LED packages exhibit kinds of color different from those exhibited by counterparts of adjoining sets of three cooperative LED packages. In an alternative, LED packages may be brought into a line as shown in FIG. 8B.

When a plurality of LED's are included in a single package, various types of arrangement can be conceivable as will be described below.

Figure 9A:
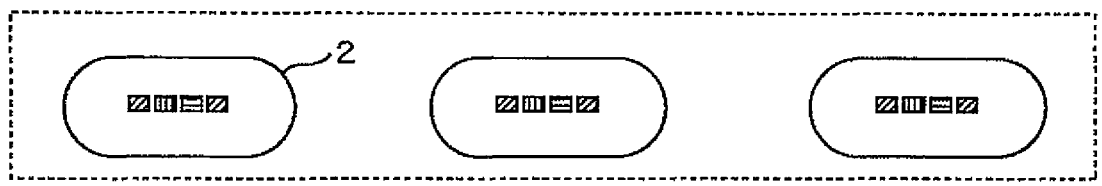
FIGS. 9A to 9D are diagrams useful to explain examples of arrangement of LED's in the illuminating device and liquid crystal display device in embodiment 3 of the invention.

Referring to FIG. 9A, an example is illustrated in which a package includes two LED's for green, one LED for red and one LED for blue. The lens shape is elongated in a direction in which a region is elongated and the LED's are arranged in the oblong direction of the region. In each LED package, the LED's for green are symmetrical to the center of a lens. With this arrangement, distributions of rays of light outgoing from the lenses associated with the LED's for green in the oblong direction of region can be so compensated as to be symmetrical with the aim of promoting the uniformity in the oblong direction of region. The in-line arrangement can facilitate connection by using lead frames (not shown in FIG. 9A).

Figures 9B, 9C:
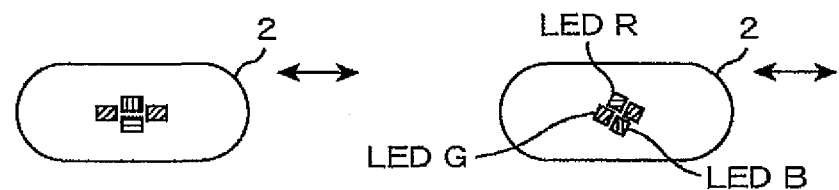
Figure 9D:
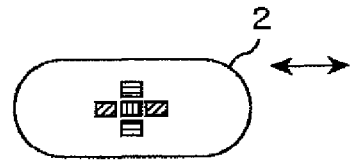

Distributions of rays of light outgoing from LED's for green in the longitudinal direction of region can be so compensated as to be symmetrical by means of the arrangements as illustrated in FIGS. 9B to 9C. For simplicity, arrowed directions represent the oblong direction of region. In an example as shown in FIG. 9D, one LED package includes five LED's.

In FIGS. 9A to 9D, the LED for which compensation is made is not always limited to one for green but because of the low efficiency of the LED for green, the LED package preferably include two LED's for green for which compensation is made. In connection with the arrangement of LED's for kinds of color other than that for which compensation is made, the relation between arrangement and color is not stipulated. For example, in FIGS. 9A to 9D, the position of the LED for red can be exchanged with that of the LED for blue.

Generally, when improving the quality of motion picture through the scrolling backlight method, for the sake of controlling the timing of scanning a gate line connected to pixels in a row and controlling the timing of turning on/off the backlight for irradiating light on a region of the pixels, LED's are controlled in respect of a row or plural rows. Accordingly, the longitudinal direction of region corresponds to the column direction (in which the gate line extends). Therefore, it is preferable that in performing the scrolling backlight method, the LED's be arranged symmetrically on a line substantially parallel to the column direction or be arranged symmetrically on a line vertical to the column direction. For promotion of uniformity in the longitudinal direction of region, the LED's may be arranged symmetrically on a line substantially parallel to the column direction and with lead frames used for wiring, the lead frames may be laid in parallel to the gate line. Having the above in mind, it is preferable that the LED's be arranged symmetrically on a line vertical to the column direction, giving rise to advantages that bending work of the lead frame can be dispensed with and the backlight manufacture process can be simplified to improve the yield and reduce energy required for production.

Especially when the width of the region is short and the distance from the LED package to the end of the region is short, making it difficult to achieve uniformity, LED's in an LED package can be so arranged as to be in a direction of minor width of the region in order to take part with their uniformity. To meet such a case, the arrangements of LED's as shown in FIGS. 9A to 9C may be rotated through 90° while keeping the direction of the lens unchanged.

Referring now to FIGS. 10A to 10D, arrangements will be described which take advantage of the fact that even when timings of lighting are temporally different between adjacent regions, different kinds of color in the adjacent regions can be mixed if the difference in lighting timing is sufficiently small.

Figure 10A:
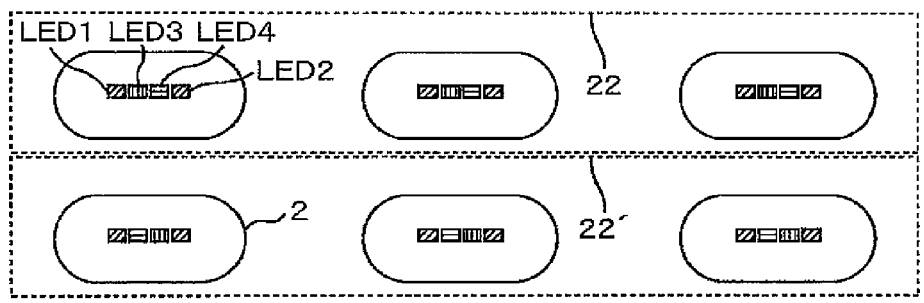
FIGS. 10A to 10D are diagrams useful to explain regions and arrangement of LED's in the illuminating device and liquid crystal display device in embodiment 3.

In FIG. 10A, LED's are arrayed in line in an LED package and between adjacent regions, two centrally arranged LED's are inverted in position. With this arrangement, non-uniformity of color possibly occurring between adjoining regions 22 and 22' can be cured.

Figure 10B:
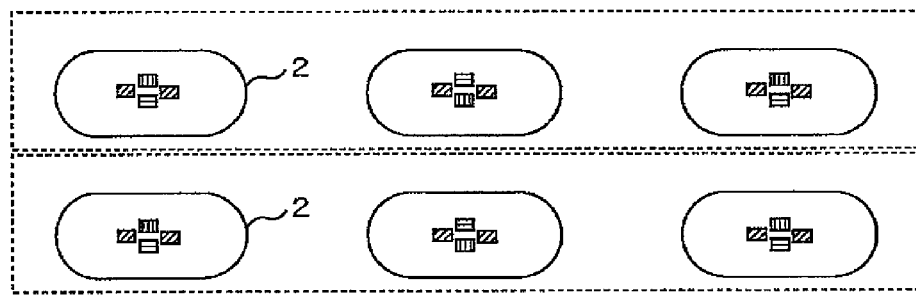
Figure 10C:
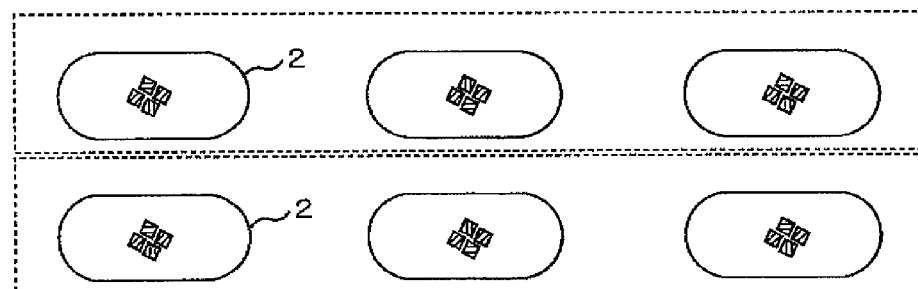

In FIGS. 10B and 10C, an LED package include first to fourth four LED's (LED's 1 to 4) and the first and second LED's of the same color are arranged symmetrically whereas the third and fourth LED's are arranged in inverted relationship between adjoining LED packages within the same region and it is so arranged that, between adjacent regions, the LED arrangement in the corresponding LED packages in the adjacent regions is made identical, thereby ensuring that non-uniformity of color can be cured.

Figure 10D:
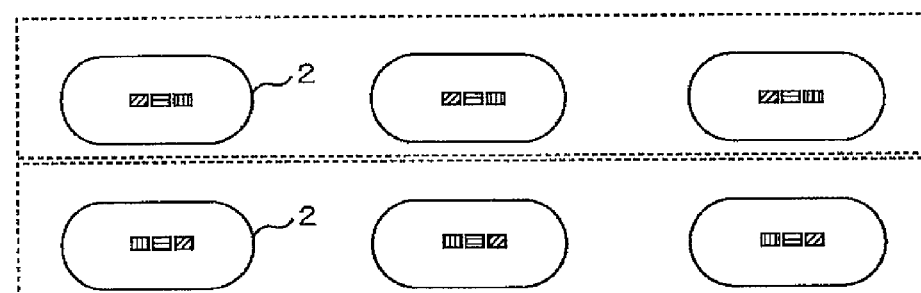
Figure 11A:
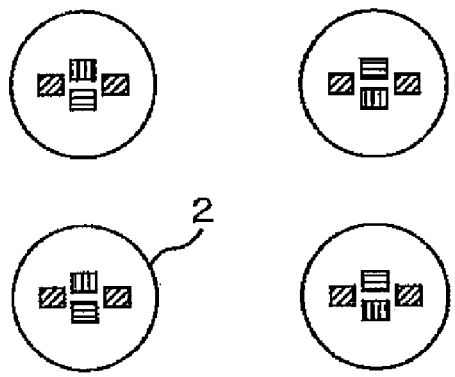
FIGS. 11A to 11D are diagrams useful to explain examples of the relation between LED package and LED arrangement in the illuminating device and liquid crystal display device in embodiment 3.
Figure 11B:
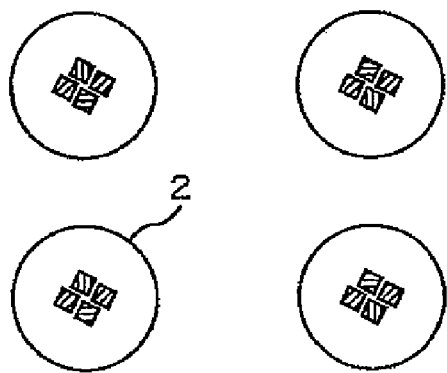
Figure 11C:
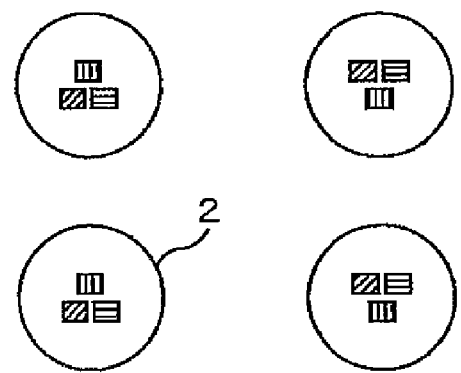
Figure 11D:
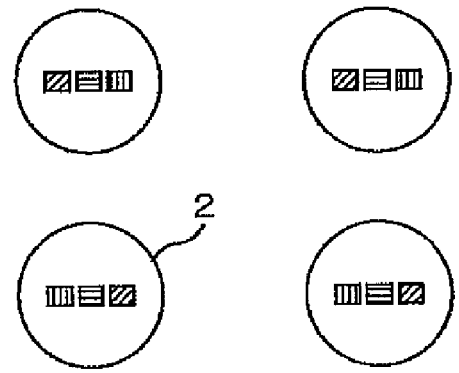

In an arrangement shown in FIG. 10D, an LED package includes first to third LED's and the position of the first and third LED's in the LED package is inverted between adjacent regions to thereby cure non-uniformity of color.

It should be understood that the aforementioned relation between the LED package and the arrangement of LED's as shown in FIGS. 10A to 10D is advantageously valid not only for the case where the regions are provided so that LED's may be driven region by region and the scrolling backlight may be applied but also for the normal case devoid of defined regions.

The aforementioned relation between the LED package and the arrangement of LED's as shown in FIGS. 10A to 10D can also fulfill itself to advantage even in the case of such a lens shape that the diameter does not change in accordance with the azimuth. Examples to this effect are illustrated in FIGS. 11A to 11D.

The region termed in the foregoing description contains a congregation of a single LED or a plurality of LED's and is associated with means for controlling the congregation of the single LED or the plurality of LED's.

Taking FIGS. 6A to 6C, for example, the illuminating device 7 is quartered into portions in the row direction, which portions have been called regions hereinbefore, and each region includes a congregation of LED packages connected in series.

Embodiment 4

In the present embodiment, not only the shape of the LED package but also the shape of a backlight frame is contrived to achieve uniformity in each region while improving characteristics of motion picture.

Reference is now made to FIGS. 12A to 12E to describe the present embodiment. An instance will be considered in which the backlight is trisected in the row direction in order to improve the quality of motion picture through the scrolling backlight method. LED's arranged in the column direction are connected in series in association with respective regions and the LED's are controlled region by region as will be described below.

Figure 12A:
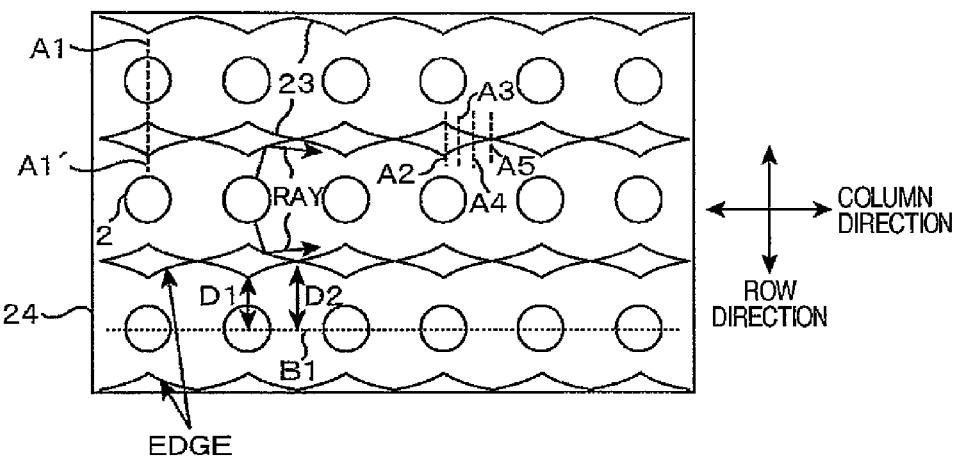
FIGS. 12A to 12E are diagrams useful to explain examples of an illuminating device and liquid crystal display device according to embodiment 4 of the present invention.

When viewed in the direction of emission of light (on the side of disposition of the liquid crystal panel), the backlight is seen as illustrated in FIG. 12A. A side reflector 23 is so shaped as to reflect, in the column direction, rays of light outputted from LED packages 2. In the thus shaped side reflector, the distance between a line B1 passing through the center of lens in parallel with the column direction and the edge of the side reflector includes a distance D2 existing in the middle between adjacent LED packages which is larger than a distance D1 existing at the center of lens. Here the edge of side reflector indicates a portion at which the side reflector rises from a flat portion of the frame. In case the side reflector rises gradually, a portion whose height is 1/10 of the height of side reflector will be termed an edge. In the figure, a simplified ray trace is exemplified as designated at RAY. The side reflector may be formed by working and shaping an iron frame 24 and bonding a white reflector sheet to the thus formed frame or by using a plastic material for the frame and working and shaping the material through cutting or injection molding. Preferably, the plastic material is white plastic.

Figure 12B:
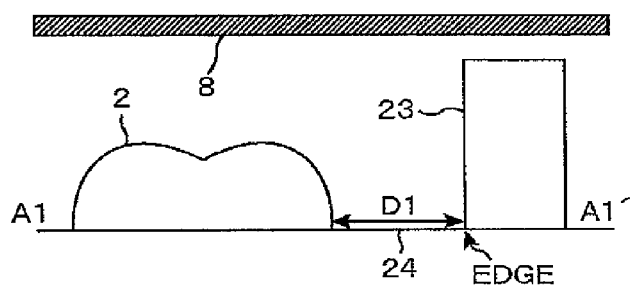
Figure 12C:
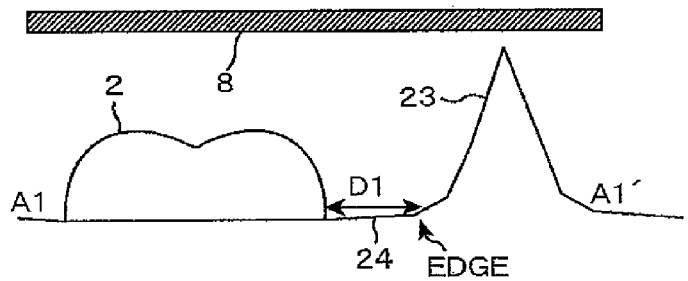
Figures 12D, 12E:
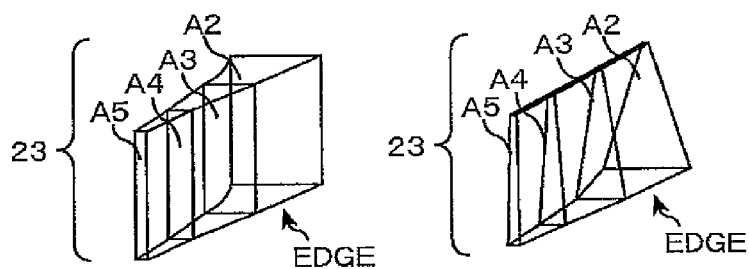

A sectional view taken on line segment A1 to A1' is illustrated in FIG. 12B or 12C. In an example shown in FIG. 12B, the side reflector 23 has a rectangular section. In this case, the wire frame has a three-dimensional form as shown in FIG. 12D. Sections A2 to A5 depicted in FIG. 12D correspond to sections A2 to A5 in FIG. 12A.

In an example shown in FIG. 12C, the side reflector 23 has a substantially triangular or trapezoid section. In this case, the wire frame has a three-dimensional form as shown in FIG. 12E. Sections A2 to A5 depicted in FIG. 12E correspond to sections A2 to A5 in FIG. 12A.

The side reflector exhibits a larger effect of reflection of light in the in-plane direction in the case of the rectangular section shown in FIG. 12B than in the case of the triangular or trapezoid section shown in FIG. 12C.

But unevenness attributable to the side reflector during turn-on of the illuminating device is less seen (or more difficult to generate) in the case of the triangular or trapezoid section as shown in FIG. 12C than in the case of the rectangular section as shown in FIG. 12B.

Figure 13A:
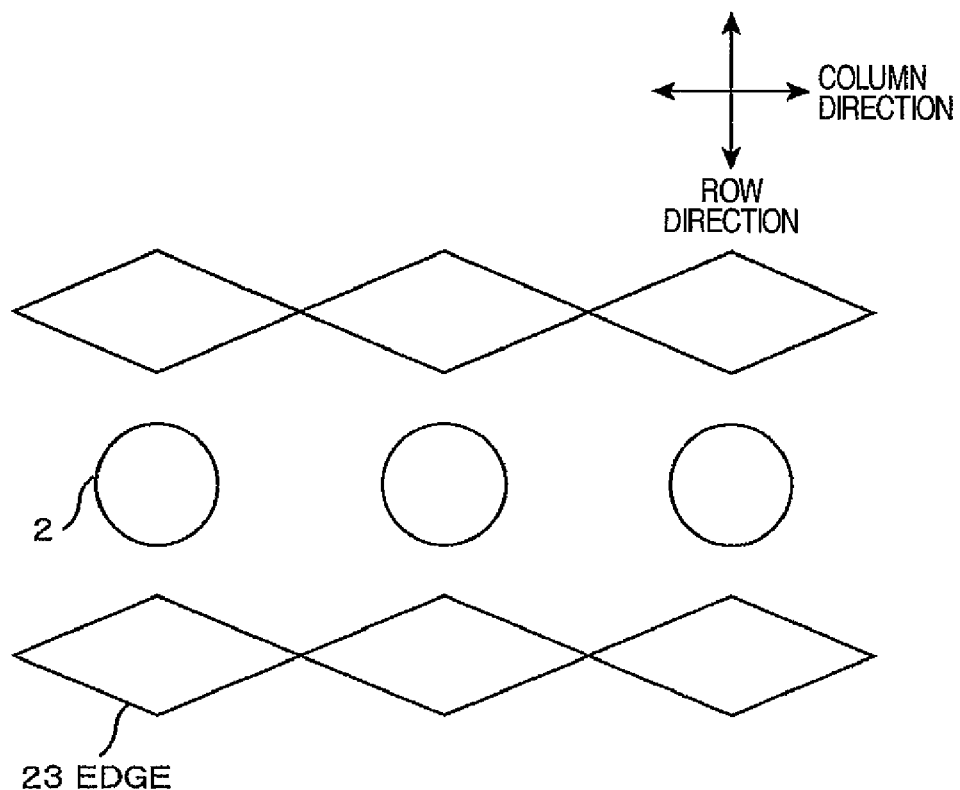
FIGS. 13A and 13B are diagrams useful to explain examples of side reflector in the illuminating device and liquid crystal display device in embodiment 4.
Figure 13B:
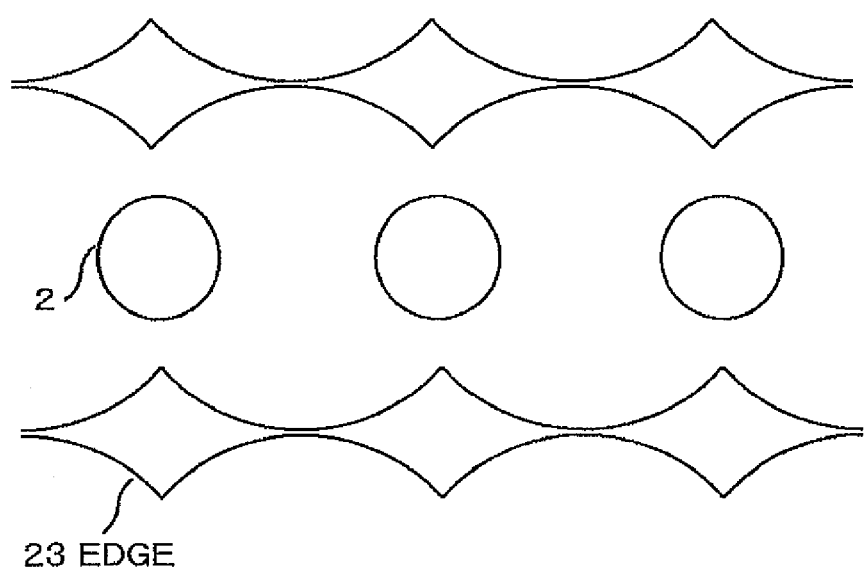

The edge of side reflector may be shaped to have a triangular waveform obtained by periodically repeating an isosceles triangle or to have a form obtained by periodically repeating an arc of ellipse or circle. Examples of these shapes are shown in FIGS. 13A and 13B. In FIG. 13A, an isosceles triangle repeats itself periodically and in FIG. 13E, an arc of ellipse repeats itself periodically.

Embodiment 5

The present embodiment intends to improve the efficiency of taking light out of the LED to the lens and to assure the uniformity.

The refractive index of an LED ranges from about 2.2 to 3.8 though depending on color and general plastic forming the lens has a refractive index of about 1.5. Consequently, total reflection takes place at the boundary between the LED and the lens and light emitted from the LED is partly trapped in the LED, causing a loss. To solve this problem, plastic having a high refractive index of about 1.6 to 2.2 is used for sealing the LED and the lens is superimposed on the plastic, thereby succeeding in improving the light takeout efficiency from the LED.

Figure 14:
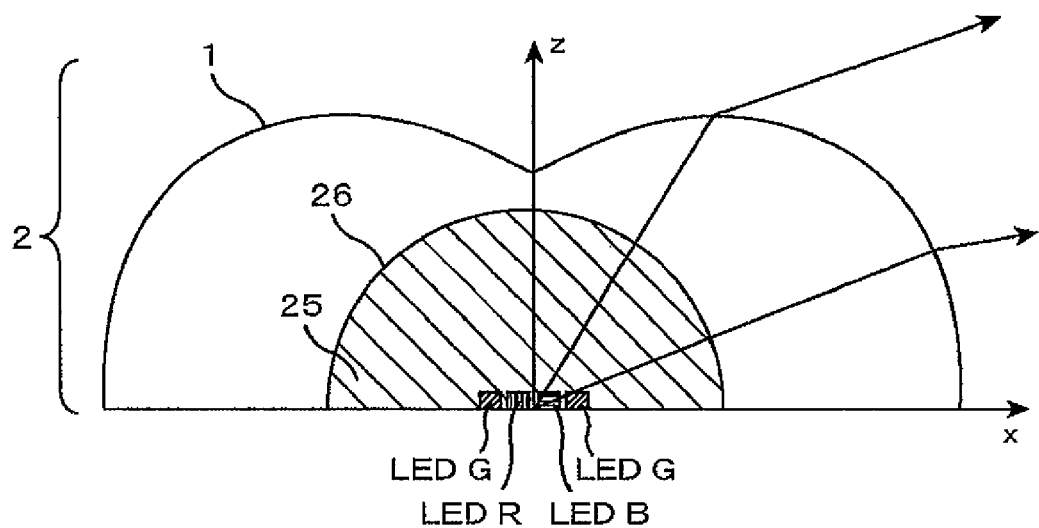
FIG. 14 is a diagram for explaining an example of an illuminating device and liquid crystal display device according to embodiment 5 of the present invention.

Reference is now made to FIG. 14 to explain the present embodiment. An LED package is sectioned on a plane to include the center of a lens as shown in FIG. 14. In the figure, the output direction of backlight lies in z-direction and an in-plane direction of the backlight surface lies in x-direction. Four LED's (LEDR, LEDG and LEDB) are sealed with a member of high refractive index. The high refractive index member 25 is formed from, for example, plastic or plastic containing titanium oxide representing high refractive index fine particles. Accordingly, in the event that the high refractive index fine particles are not mixed uniformly, the refractive index will sometimes have a distribution within the plastic. A member (medium) containing a substance of high refractive index is used as the high refractive index member. Needless to say, a member formed from a material having a high refractive index by itself without resort to mixture is also called a high refractive index member. Plastic having a lens shape is mounted on the outer periphery of the high refractive index member 25. Here, the plastic member having the lens form is called a lens 1. A boundary 26 between lens 1 and high refractive index member 25 is shaped into a semicircle having its center at the origin (in the figure, the origin of x-z plane or sometimes called the center of lens hereinafter).

The lens is designed on the presupposition that a point source is at the original and hence, in the event of occurrence of refraction at the boundary 26, there arises a problem that light cannot go out of the lens in a predetermined direction. But, by making the shape of boundary 26 semicircular as shown in FIG. 14, light emitted from the vicinity of the origin is hardly refracted, thereby solving the above problem. When the lens has an isotropic shape in the in-plane of the backlight, the sectional form is semicircular and the boundary 26 has a three-dimensionally semispherical shape.

However, depending on the shape of the LED package or the production method, the shape of boundary 26 will not sometimes be circular within a region of a large polar angle of 70° to 90° (angle making to z-axis) but this does not matter if an arc shape can be formed in an angle range in which light can be controlled by positively utilizing the lens. In other words, as far as the shape of the boundary partly forms an arc, the above effect is valid. Specifically, within a range of polar angle of about 0° to 50°, the lens is utilized positively. Light emitted from the LED at an angle larger than 50° is originally large in output angle from the LED unless the boundary and lens are so shaped as to extremely differ from a circle and the light can reach a remote site. Preferably, the boundary surface may be mirror finished so as to be less uneven. This is effective to suppress unwanted scattering at the boundary surface.

Next, a description will be given of a production method. At least two types of production can be enumerated as below. In one method, when sealing the LED with the high refractive index member, the high refractive index member is injection-molded and thereafter, either a separately produced lens is bonded or a lens is formed directly on the high refractive index member through injection molding. In bonding the separately produced lens, an boding agent preferably has a refractive index which is comparable to or higher than that of the lens. This is to suppress occurrence of unwanted refraction or total reflection during transmission of light to the lens through the bonding agent. Specifically, a refractive index of about 1.5 is preferable.

Figure 15:
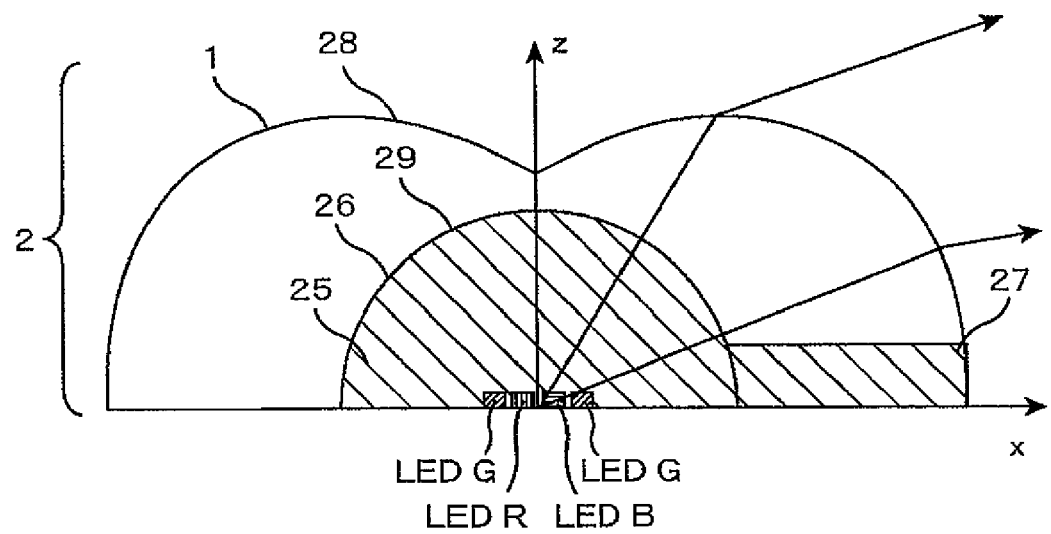
FIG. 15 is a diagram useful to explain another example of the illuminating device and liquid crystal display device in embodiment 5 of the invention.

The second method will be described with reference to FIG. 15. Firstly, a lens is produced through injection molding. On the presupposition that an output surface 28 of the lens is bounded by air and an incident surface 29 is bounded by the high refractive index member 25, a hole 27 passing through the output surface to the incident surface is bored. After the lens is arranged on the backlight, the high refractive index member is filled into the hole 27 so as to be molded with a mold congruent to the incident surface of the lens.

Embodiment 6

In embodiment 5, in a section of the LED package including the center of lens, the boundary 26 between high refractive index member 25 and lens 1 is shaped to a circular form in order that unwanted refraction at the boundary 26 can be reduced to permit the distribution of light outgoing from the lens to have a predetermined distribution. The present embodiment utilizes the shape of boundary 26 as a surface for controlling light as will be described below.

Figure 16:
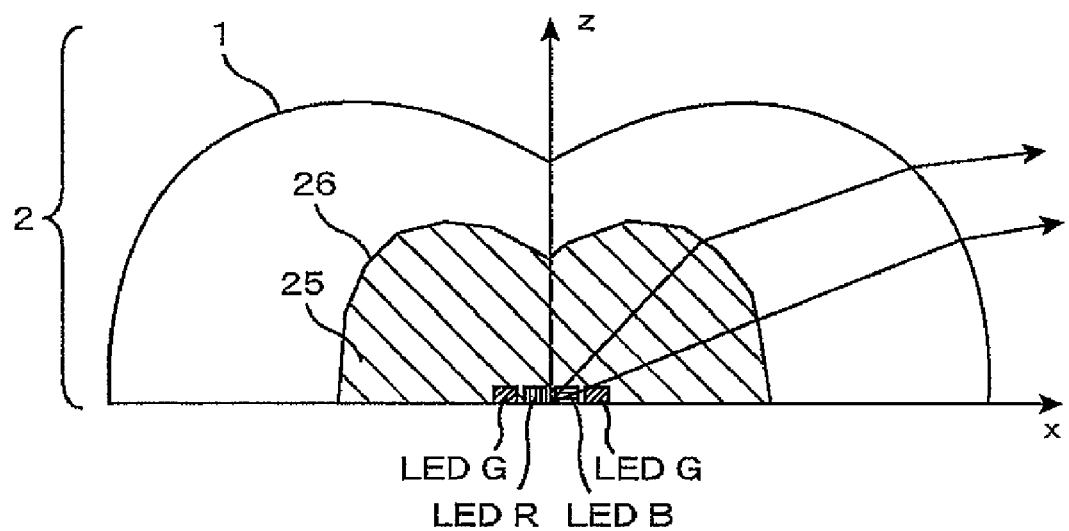
FIG. 16 is a diagram for explaining an illuminating device and liquid crystal display device according to embodiment 6 of the present invention.

Referring to FIG. 16, an LED package is illustrated in a sectional form including the center of lens as in the case of FIG. 14. Reference numerals or symbols in FIG. 16 are identical to those in FIG. 14. The boundary 26 in section is not shaped to a circle but shaped to a form which is recessed near x=0. This shape ensures that the light going out of the high refractive index member 25 so as to be incident on the lens 1 can be refracted at the boundary 26 and can go out in an in-plane direction (45° to 90° large polar angle direction). This light can again be refracted at the output surface of lens 1 toward the in-plane direction, thereby enabling much light to go out in the in-plane direction. Particularly, by providing two refractive surfaces, light emitted from the LED at about 0° to 45° critically conditioned for outgo toward the in-plane direction with a single refractive surface can go out toward the in-plane direction. The boundary 26 capable of giving full play to the output characteristics as above can be shaped as will be described below.

In the sectional form of LED package including the lens center, the boundary is to be shaped to have a recess near the center of lens 1.

Where the distance from the center of lens 1 to the boundary is defined as an inner moving radius and the angle making to the center axis vertical to the plane on which the LED package is located and passing through the center of lens 1 is defined as a polar angle in the sectional form of the LED package including the lens center, the boundary is to be shaped to have a region in which as the polar angle increases, the inner moving radius increases.

The boundary is to be so shaped as not to have a region in which at almost all polar angles, the inner moving radius decreases as the polar angle increases.

The boundary is to be shaped such that in the region in which as the polar angle increases, the inner moving radius increases, a polar angle is included having a value equal to a critical angle the material constituting the high refractive index member 25 has in relation to the member constituting the lens 1. Specifically, the critical angle is about 38° to 60°.

Also, specifically, in the sectional form of the LED package including the lens center, the boundary and the lens may be shaped to be an arc of an ellipse having a major axis in the x-axis direction and a minor axis in the z-axis direction.

Embodiment 7

In embodiment 6, the boundary 26 is so shaped as to be utilized as a surface for controlling light with a view to causing light to go out in the in-plane direction to thereby unify rays of output light. In embodiment 7, a technique will be described which assures uniformity in respect of individual arbitrary regions and reduction in lens shape to realize material reduction leading to reduction in garbage.

Figure 17:
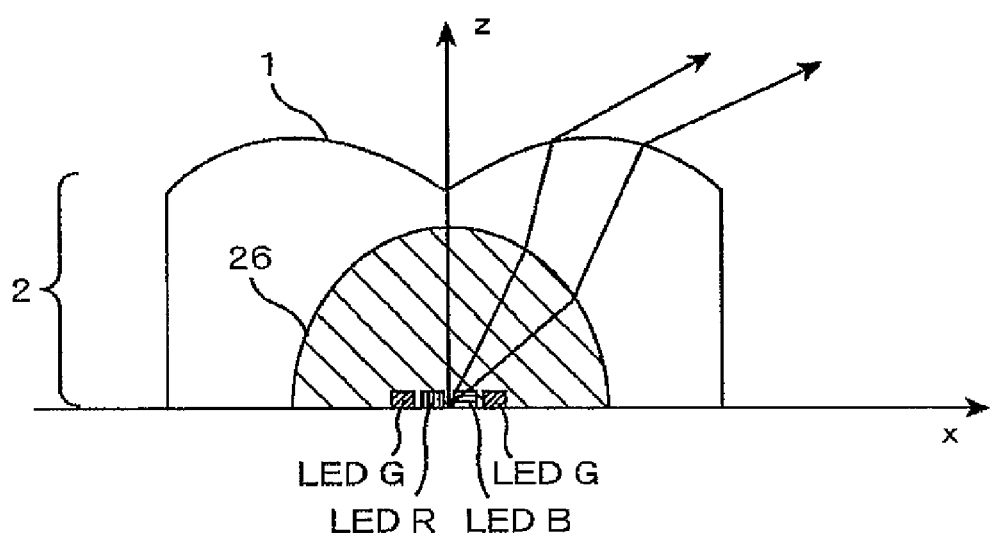
FIG. 17 is a diagram for explaining an example of an illuminating device and liquid crystal display device according to embodiment 7 of the present invention.

Referring to FIG. 17, an LED package is illustrated in sectional form including the center of a lens as in the case of FIG. 14. Reference numerals and symbols in FIG. 17 are the same as those in FIG. 14. In the sectional form, the boundary 26 is shaped elliptically having a major axis in the z-axis direction and a minor axis in the x-axis direction. This shape enables much light to be irradiated to a narrower region than that by the LED package explained in embodiment 6 but is advantageous for uniformity of light illumination in respect of individual predetermined regions. Further, the lens shape can be reduced to advantage to attain material reduction leading to garbage reduction. Most of light emitted from the LED and refracted at the boundary is incident on a narrow range of output surface of the lens (range of polar angles 0° to 45°) and therefore, the lens can be shaped restrictedly within the narrow range and can be reduced in size.

Figure 18A:
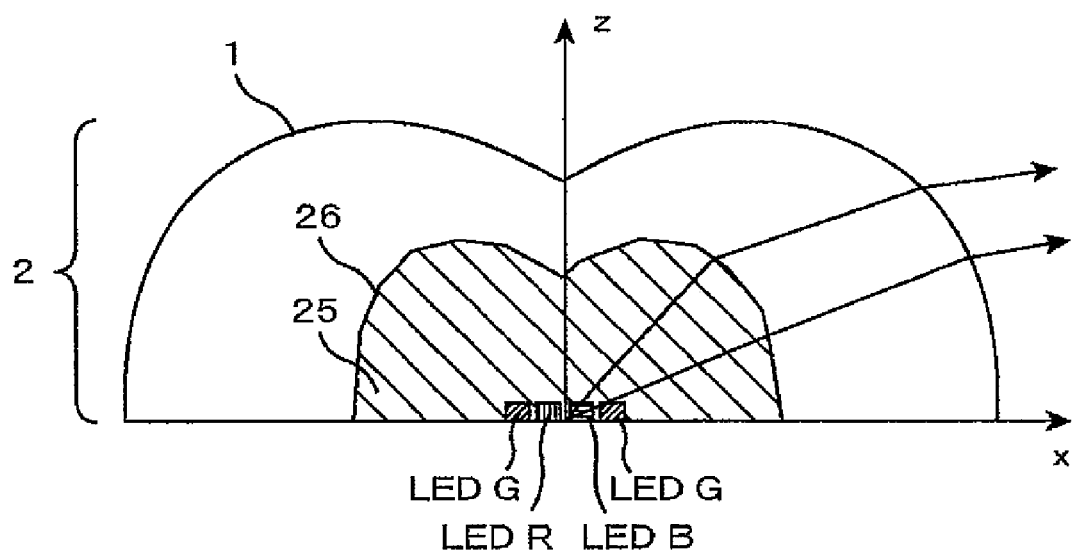
FIGS. 18A and 18B are diagrams useful to explain further examples of the illuminating device and liquid crystal display device in embodiment 7 of the invention.
Figure 18B:
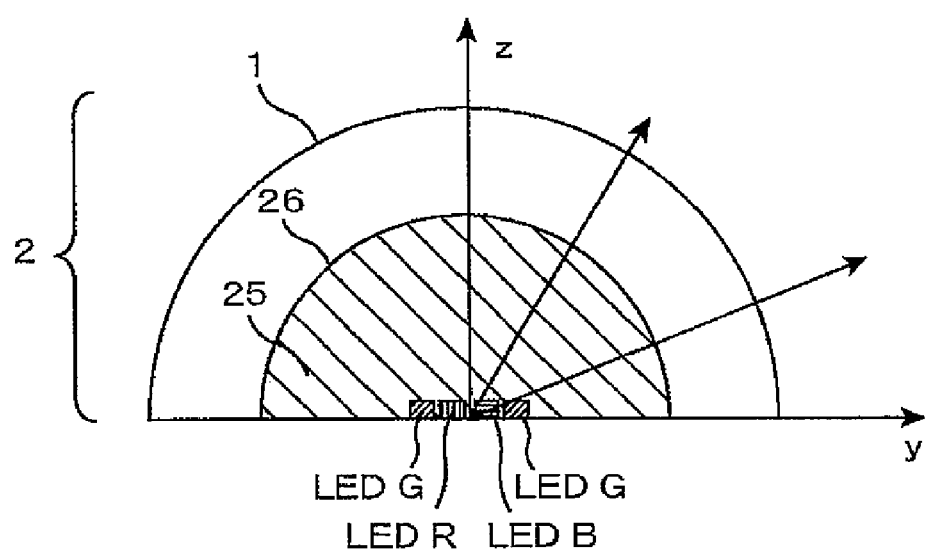

When making light illumination uniform in respect of individual arbitrary regions of the illuminating device, specially, achieving uniformity in the column direction for the purpose of performing the scrolling backlight method, the construction as shown in FIGS. 18A and 18B can be conceived. In the figure, x-direction is parallel to the column direction and y-direction is parallel to the row direction. A sectional form of an LED package including the lens center as shown in FIG. 18A is taken on the x-z plane. A sectional form of an LED package including the lens center as shown in FIG. 18B is taken on the y-z plane. Thus, the shape of the LED package is anisotropic and the lens 1 and boundary 26 are so shaped as to output much light in the in-plane direction in the x direction (column direction). But the lens 1 and boundary 26 are so shaped as to output light uniformly at all angles (polar angles) in the y-direction (row direction). With the shape as above, uniformity of light can be facilitated in the row direction. In FIG. 18A, the boundary 26 is shaped to have a recess near the center of lens 1 but the boundary 26 and lens 1 may be shaped as a spheroid having a major axis in the x-axis direction, a minor axis in the y-direction and an axis of rotation represented by z-axis.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A liquid crystal display device comprising:
   a liquid crystal panel having a pair of substrates, a liquid crystal layer sandwiched between said paired substrates, data lines for applying to said liquid crystal layer a voltage corresponding to image data at a predetermined timing and gate lines, a plurality of active elements connected to intersections of said data lines and said gate lines and pixels driven by said active elements; and
   an illuminating device having a plurality of LED packages each including LED's and a lens, said LED packages being congregated on a plane in a large area to provide a backlight for irradiating light to said liquid crystal panel,
   wherein, on a plane substantially parallel to said liquid crystal panel, denoted as a column direction is a direction substantially parallel to a direction in which the gate line extends and denoted as a row direction is a direction substantially orthogonal to the column direction, the bottom of said backlight having the congregated LED packages being divided into two or more plural regions, and there is provided means for driving the LED's individually or in respect of each of said plurality of regions and said lens in each of said LED packages has different widths between in the column and row directions.

2. A liquid crystal display device according to claim 1, wherein when a region to which said LED packages belong is elongate in the column direction, each LED package includes a lens having a lens width in the column direction which is longer than that in the row direction but when a region to which said LED packages belong is elongate in the row direction, each LED package includes a lens having a lens width in the column direction which is shorter than that in the row direction.

3. A liquid crystal display device according to claim 1, wherein some of said LED packages in one of said regions include a lens having its width which differs in accordance with the azimuth and the rest includes a lens having its width which is constant irrespective of the azimuth.

4. A liquid crystal display device according to claim 1, wherein:
   the bottom of said backlight having the congregated LED packages is divided into two or more regions in at least the row direction and means for driving the LED's individually or in respect of each of said plurality of regions is provided; and
   said lens in each of said LED packages has a lens width in the column direction which is longer than that in the row direction.

5. A liquid crystal display device according to claim 1, comprising means for electrically connecting in series a plurality of LED packages existent in the column direction and driving the LED's in respect of each of said plurality of connected LED packages.

6. A liquid crystal display device according to claim 1, comprising means for arranging said LED packages in matrix on the bottom of backlight and driving LED's in respect of a row or a plurality of rows.

7. A liquid crystal display device according to claim 1, wherein each of said LED packages includes at least an LED for emitting light in red, an LED for emitting light in green and an LED for emitting light in blue.

8. A liquid crystal display device according to claim 1, wherein each of said LED packages includes at least four LED's corresponding to LED's for emitting at least red, green and blue, and at least two LED's in each LED package are arranged symmetrically to the center of lens and emit the same color.

9. A liquid crystal display device according to claim 8, wherein all LED's in each LED package are brought into a line.

10. A liquid crystal display device according to claim 8, wherein at least one set of LED's positioned symmetrically to the lens center in each LED package are two LED's positioned at the remotest distance from the center.

11. A liquid crystal display device according to claim 10, wherein each LED package includes four LED's of which two LED's positioned farthest from the center are LED's for green.

12. A liquid crystal display device according to claim 8, wherein when the number of LED's included in each LED package is five, one LED is arranged in the center of the lens, two LED's in the rest grouped in respective ones of two sets are arranged symmetrically to the lens center in respect of the individual sets and the LED's constituting each set are for the same color in respect of the individual sets, one of said two sets being a set of LED's for green.

13. A liquid crystal display device according to claim 8, wherein at least one set of LED's arranged symmetrically with respect to the center of lens are arranged on a line substantially parallel to the column direction.

14. A liquid crystal display device according to claim 13, wherein in each LED package, the LED's arranged symmetrically with respect to the center of lens are arranged on a line substantially parallel to the column direction.

15. A liquid crystal display device according to claim 1, wherein said lens is so shaped as to have a region in which the distance between a plane on which each LED package is located and a surface of the lens is longer in the region than at the center of the lens.

16. A liquid crystal display device according to claim 1, wherein when in said lens, the distance from the center of lens to a lens surface is defined as a moving radius and the angle making to a center axis being vertical to the location plane on which said LED packet is located and passing through the lens center is defined as a polar angle, said lens is so shaped, in a sectional form taken on a plane containing the center axis, as to have a region in which as the polar angle increases, the moving radius increases.

17. A liquid crystal display device according to claim 16, wherein in a sectional form taken on at least a plane being substantially parallel to the column direction and containing the center axis, said lens is so shaped as to have a region in which as the polar angle increases, the moving radius increases.

18. A liquid crystal display device according to claim 1, wherein each of said LED packages includes LED's for emitting at least red, green and blue, and at least two kinds of LED packages are provided in which the arrangement of LED's in one kind of LED package is different from that of LED's in the other kind of LED package.

19. A liquid crystal display device according to claim 8, wherein in each LED package, at least one set of LED's positioned symmetrically with respect to the center of lens are arranged on a line substantially vertical to the column direction.

20. A liquid crystal display device according to claim 8, wherein in each LED package, all LED's are brought into a line so as to be arranged on a line substantially parallel to the column direction.

21. A liquid crystal display device according to claim 8, wherein in each LED package, all LED's are brought into a line so as to be arranged on a line substantially vertical to the column direction.

22. A liquid crystal display device comprising:

a liquid crystal panel having a pair of substrates, a liquid crystal layer sandwiched between said paired substrates, data lines for applying to said liquid crystal layer a voltage corresponding to image data at a predetermined timing and gate lines, a plurality of active elements connected to intersections of the data lines and the gate lines and pixels driven by the active elements; and an illuminating device having a plurality of LED packages each including LED's and a lens, said LED packages being congregated on a plane in a large area to provide a backlight for irradiating light to said liquid crystal panel, wherein, on a plane substantially parallel to said liquid crystal panel, denoted as a column direction is a direction substantially parallel to a direction in which the gate line extends and denoted as a row direction is a direction substantially orthogonal to the column direction, the bottom of said backlight having the congregated LED packages being divided into two or more plural regions, and there is provided means for driving the LED's individually or in respect of each of said plurality of regions, and said lens in each of said LED packages has a portion which differs in width in accordance with the azimuth.

23. A liquid crystal display device according to claim 22, wherein when a region to which said LED packages belong is elongate in the column direction, each LED package includes a lens having a lens width in the column direction which is longer than that in the row direction but when a region to which said LED packages belong is elongate in the row direction, each LED package includes a lens having a lens width in the column direction which is shorter than that in the row direction.

24. A liquid crystal display device according to claim 22, wherein some of said LED packages in one of said regions include a lens having its width which differs in accordance with the azimuth and the rest includes a lens having its width which is constant irrespective of the azimuth.

25. A liquid crystal display device according to claim 22, wherein the bottom of said backlight having the congregated LED packages is divided into two or more regions in at least the row direction and means for driving the LED's individually or in respect of each of said plurality of regions is provided; and said lens in each of said LED packages has a lens width in the column direction which is longer than that in the row direction.

26. A liquid crystal display device according to claim 25, comprising means for electrically connecting in series a plurality of LED packages existent in the column direction and driving the LED's in respect of each of said plurality of connected LED packages.

27. A liquid crystal display device according to claim 22, comprising means for arranging said LED packages in matrix on the bottom of backlight and driving LED's in respect of a row or a plurality of rows.

28. A liquid crystal display device according to claim 22, wherein each of said LED packages includes at least an LED for emitting light in red, an LED for emitting light in green and an LED for emitting light in blue.

29. A liquid crystal display device according to claim 22, wherein each of said LED packages includes at least four LED's corresponding to LED's for emitting at least red, green and blue, and at least two LED's in each LED package are arranged symmetrically to the center of lens and emit the same color.

30. A liquid crystal display device according to claim 22, wherein said lens is so shaped as to have a region in which the distance between a plane on which each LED package is located and a surface of the lens is longer in the region than at the center of the lens.

31. A liquid crystal display device according to claim 22, wherein when in said lens, the distance from the center of lens to a lens surface is defined as a moving radius and the angle making to a center axis being vertical to the location plane on which said LED packet is located and passing through the lens center is defined as a polar angle, said lens is so shaped, in a sectional form taken on a plane containing the center axis, as to have a region in which as the polar angle increases, the moving radius increases.

32. A liquid crystal display device according to claim 31, wherein in a sectional form taken on at least a plane being substantially parallel to the column direction and containing the center axis, said lens is so shaped as to have a region in which as the polar angle increases, the moving radius increases.

33. A liquid crystal display device according to claim 22, wherein each of said LED packages includes LED's for emitting at least red, green and blue, and at least two kinds of LED packages are provided in which the arrangement of LED's in one kind of LED package is different from that of LED's in the other kind of LED package.

* * * * *